United States Patent
Wang et al.

(10) Patent No.: US 10,890,554 B1
(45) Date of Patent: Jan. 12, 2021

(54) SENSORS WITH A NON-PLANAR SENSING STRUCTURE

(71) Applicant: GLOBALFOUNDRIES Singapore Pte. Ltd., Singapore (SG)

(72) Inventors: Lanxiang Wang, Singapore (SG); Eng Huat Toh, Singapore (SG); Shyue Seng Tan, Singapore (SG); Ping Zheng, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/447,312

(22) Filed: Jun. 20, 2019

(51) Int. Cl.
| | |
|---|---|
| *H01L 27/148* | (2006.01) |
| *G01N 27/414* | (2006.01) |
| *H01L 29/423* | (2006.01) |
| *H01L 21/84* | (2006.01) |
| *H01L 27/12* | (2006.01) |
| *H01L 29/78* | (2006.01) |

(52) U.S. Cl.
CPC ......... *G01N 27/414* (2013.01); *H01L 21/845* (2013.01); *H01L 27/1211* (2013.01); *H01L 29/42364* (2013.01); *H01L 29/785* (2013.01)

(58) Field of Classification Search
CPC ............ G01N 27/414; H01L 29/42364; H01L 29/785; H01L 27/1211; H01L 21/845
See application file for complete search history.

(56) References Cited

U.S. PATENT DOCUMENTS

| | | | |
|---|---|---|---|
| 8,940,569 B2 | 1/2015 | Bedell et al. | |
| 2014/0264466 A1* | 9/2014 | Fife | G01N 27/414 257/253 |
| 2014/0264470 A1* | 9/2014 | Fife | G01N 27/4148 257/253 |

OTHER PUBLICATIONS

Prodromakis et al., "Exploiting CMOS Technology to Enhance the Performance of ISFET Sensors", IEEE Electron Device Letters, vol. 31, No. 9, Sep. 2010.
Peter Kurzweil, "Metal Oxides and Ion-Exchanging Surfaces as pH Sensors in Liquids: State-of-the-Art and Outlook", Sensors 2009, 9, 4955-4985.
Rothberg et al., "An integrated semiconductor device enabling non-optical genome sequencing", Nature, vol. 475, Jul. 21, 2011.
Jang et al., "Performance Enhancement of Capacitive-Coupling Dual-gate Ion-Sensitive Field-Effect Transistor in Ultra-Thin-Body", Scientific Reports vol. 4, Article No. 5284 (2014).
Huang et al., "High Performance Dual-Gate ISFET with Non-ideal Effect Reduction Schemes in a SOI-CMOS Bioelectrical SoC", 2015 IEEE International Electron Devices Meeting (IEDM), Washington DC, 2015, pp. 29.2.1-29.2.4.

* cited by examiner

Primary Examiner — Robert G Bachner
(74) Attorney, Agent, or Firm — Thompson Hine LLP

(57) ABSTRACT

Structures for a sensor and fabrication methods for a sensor. Features each having a top surface and a plurality of side surfaces are formed. A sensing layer is formed on the top surface and the side surfaces of each feature, and an interconnect structure having one or more interlayer dielectric layers is formed over the features. The one or more interlayer dielectric layers include a cavity arranged to expose the sensing layer, and the sensing layer is composed of a material that is sensitive to a property of an analyte solution provided in the cavity.

20 Claims, 10 Drawing Sheets

SENSORS WITH A NON-PLANAR SENSING STRUCTURE

BACKGROUND

The invention relates generally to semiconductor device and integrated circuit fabrication and, in particular, to structures including sensors and fabrication methods for a sensor.

Sensors based on an ion-sensitive field effect transistor (ISFET) can be integrated with modern microelectronic devices and used to detect and measure various aspects of chemical reactions and substance properties. For example, an ion-sensitive field effect transistor may be used as a sensor to measure ion concentrations, such as hydrogen ion concentrations, in a sample of an analyte solution. An ion-sensitive field effect transistor is similar to a metal-oxide-semiconductor field-effect transistor (MOSFET), but lacks a gate electrode. Instead, an ion-sensitive layer is placed over the channel region of the ion-sensitive field-effect transistor and is exposed to the analyte sample. An operating characteristic of the ion-sensitive field-effect transistor may be measured and used to calculate ion concentration in the analyte solution. For example, the source-drain current through the ion-sensitive field-effect transistor may change as a function of ion concentration. Due to limitations on the dimensions of the sensing area, ion-sensitive field-effect transistors may have a low sensing capacitance and a low pH sensitivity.

Improved structures for a sensor and fabrication methods for a sensor are needed.

SUMMARY

In an embodiment of the invention, a structure for a sensor includes a plurality of features each having a top surface and a plurality of side surfaces, a sensing layer on the top surface and the side surfaces of each feature, and an interconnect structure having one or more interlayer dielectric layers over the features. The one or more interlayer dielectric layers include a cavity arranged to expose the sensing layer. The sensing layer is composed of a material that is sensitive to a property of an analyte solution provided in the cavity.

In an embodiment of the invention, a method of forming a sensor includes forming a plurality of features each having a top surface and a plurality of side surfaces, forming a sensing layer on the top surface and the side surfaces of each feature, forming an interconnect structure including one or more interlayer dielectric layers over the features, and forming a cavity in the one or more interlayer dielectric layers that is arranged to expose the sensing layer. The sensing layer is composed of a material that is sensitive to a property of an analyte solution provided in the cavity.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
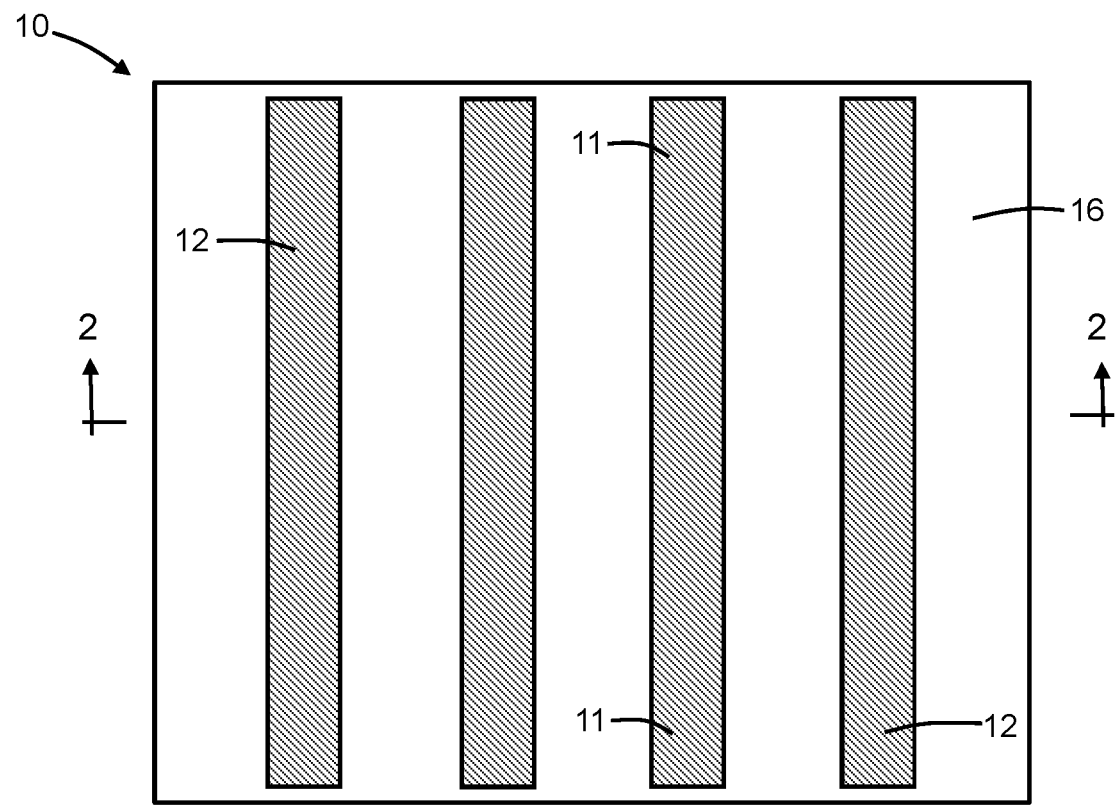
FIG. 1 is top view of a structure at a fabrication stage of a processing method in accordance with embodiments of the invention.
Figure 2:
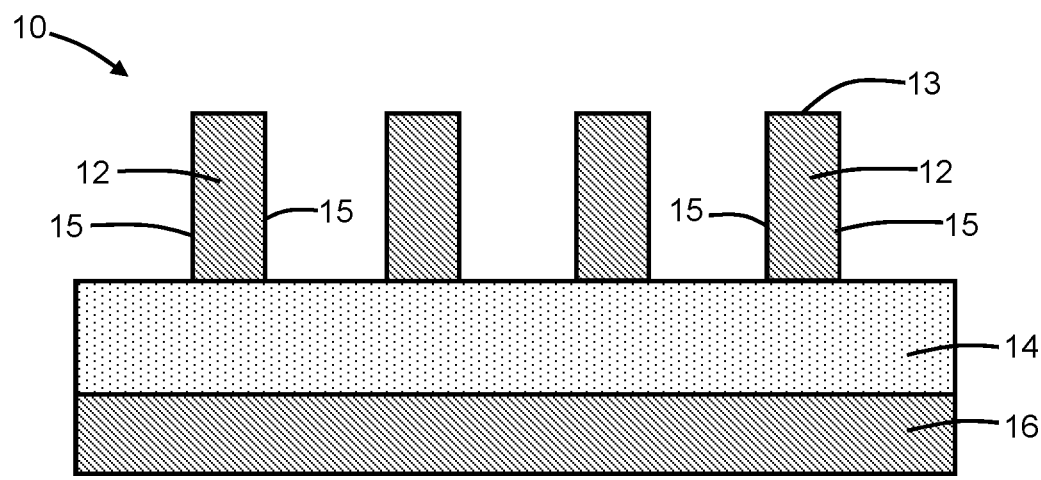
FIG. 2 is a cross-sectional view of the structure taken generally along line 2-2 in FIG. 1.

With reference to FIGS. 1, 2 and in accordance with embodiments of the invention, a structure 10 for a sensor includes multiple fins 12 that are arranged in a one-dimensional array over a dielectric layer 14. The fins 12 are three-dimensional mandrel shapes with a top surface 13 and side surfaces 15 in the form of sidewalls extending from the top surface 13 to the dielectric layer 14. The fins 12 may extend between opposite end regions 11 along respective longitudinal axes, which may have a substantially parallel alignment.

The fins 12 may be formed by patterning a device layer of a semiconductor-on-insulator (SOI) wafer with lithography and etching processes or with a self-aligned multi-patterning process. The fins 12 may be patterned with given dimensions, such as length, width, and thickness, and may be placed in the one-dimensional array with a given pitch parallel to the width dimension. The SOI wafer may further include a buried oxide (BOX) layer that provides the dielectric layer 14 and a substrate 16. The dielectric layer 14 is arranged between the fins 12 formed from the device layer and the substrate 16. The fins 12 and the substrate 16 may be composed of a single-crystal semiconductor material, such as single-crystal silicon. A well (not shown) may be formed in the substrate 16 by, for example, ion implantation before the fins 12 are patterned.

Figure 3:
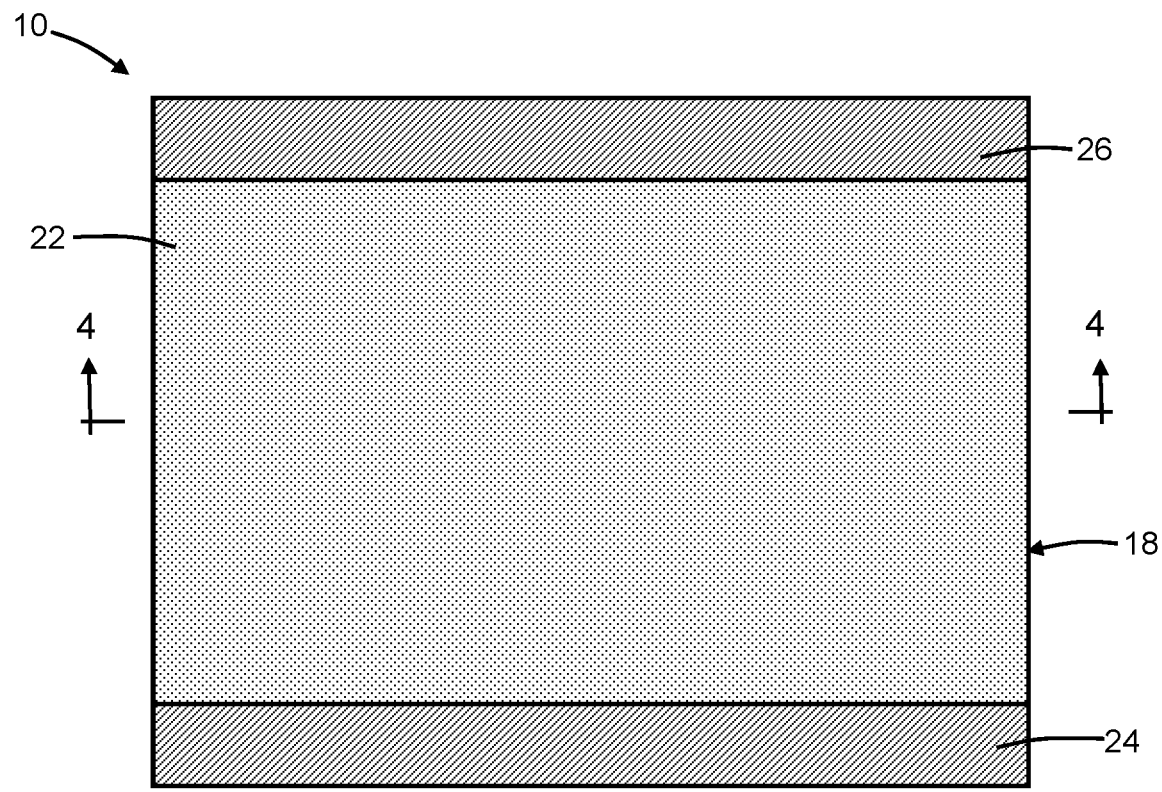
FIG. 3 is top view of the structure at a fabrication stage subsequent to FIG. 1.
Figure 4:
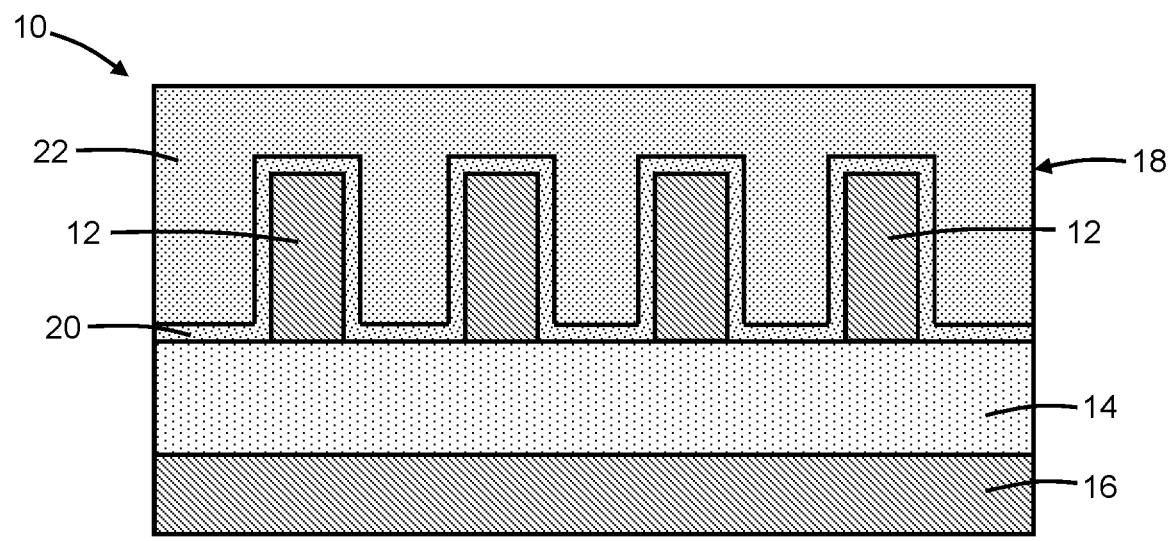
FIG. 4 is a cross-sectional view of the structure taken generally along line 4-4 in FIG. 3.

With reference to FIGS. 3, 4 in which like reference numerals refer to like features in FIGS. 1, 2 and at a subsequent fabrication stage of the processing method, a sacrificial gate structure 18 is formed that extends transversely across the fins 12 and the dielectric layer 14 between the fins 12. The sacrificial gate structure 18 may include a dielectric layer 20 and a dummy gate 22 arranged over the dielectric layer 20. The dielectric layer 20 may be a thin layer composed of silicon dioxide or a high-k dielectric material, such as hafnium oxide. The dielectric layer 20 is conformally formed on the exposed surfaces 13, 15 (FIG. 2) of the fins 12 and the surface of the dielectric layer 14. The dummy gate 22 may be composed of a semiconductor material, such as amorphous silicon, that is deposited by chemical vapor deposition and patterned with reactive ion etching using a hardmask. A dielectric cap (not shown) may be arranged over the sacrificial gate structure 18 and may be a remnant of a hardmask used during patterning.

Halos and source/drain extensions (not shown) may be formed after the sacrificial gate structure 18 is formed. The halos and source/drain extensions may be formed by ion implantation of one or more dopants having given conductivity types.

Source/drain regions 24, 26 are formed adjacent to the opposite end regions 11 (FIG. 1) of the fins 12. As used herein, the term "source/drain region" means a doped region of semiconductor material that can function as either a source or a drain of a field-effect transistor. The source/drain regions 24, 26 may be formed by an epitaxial growth process in which semiconductor material grows from the exposed surfaces 13, 15 at the opposite end regions 11 of each fin 12, which are not covered by the sacrificial gate structure 18. The semiconductor material growing laterally from the different fins 12 may merge to define the source/drain regions 24, 26. The semiconductor material constituting the source/drain regions 24, 26 may be heavily doped during epitaxial growth with either an n-type dopant (e.g., phosphorus and/or arsenic) that provides n-type electrical conductivity or a p-type dopant (e.g., boron) that provides p-type electrical conductivity.

Figure 5:
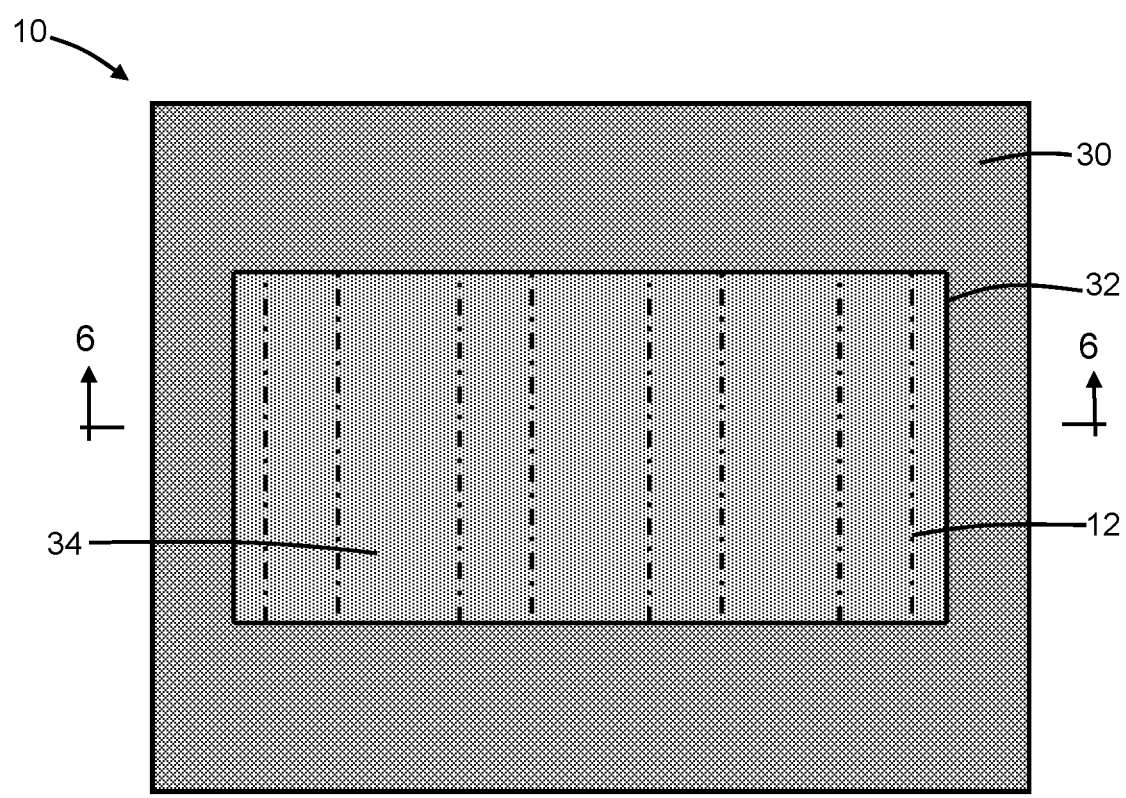
FIG. 5 is top view of the structure at a fabrication stage subsequent to FIG. 3.
Figure 6:
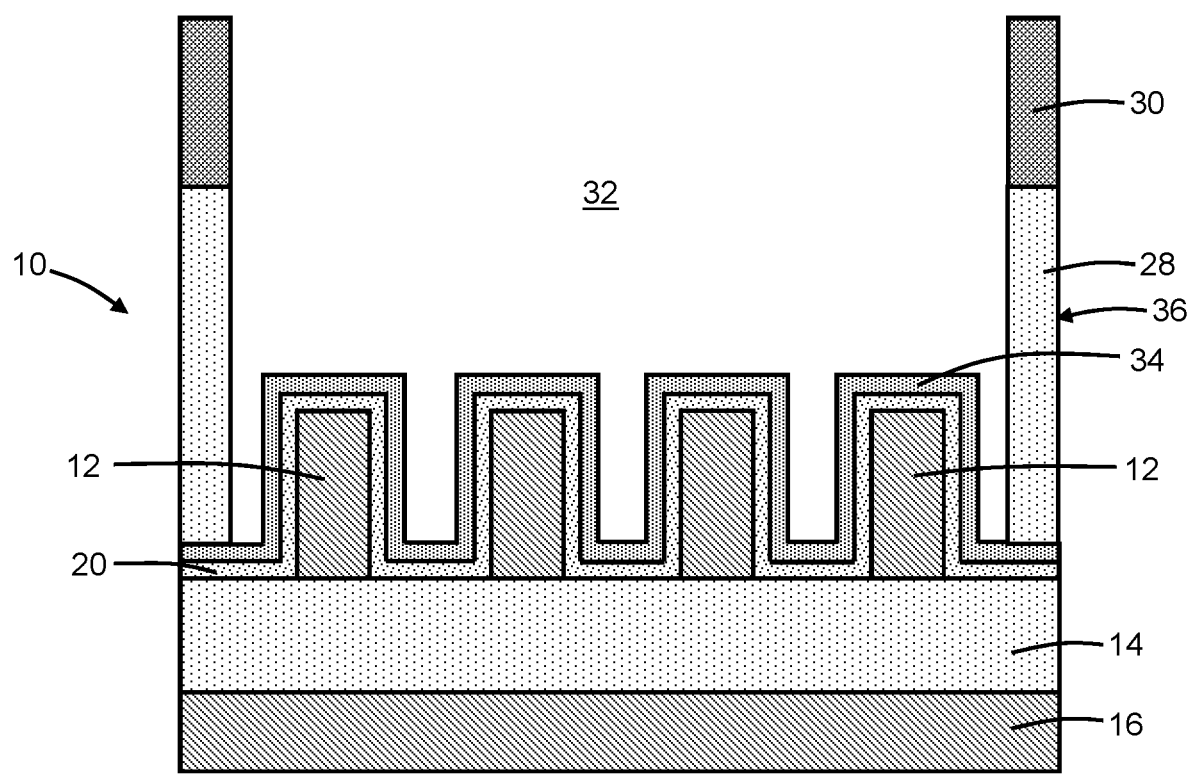
FIG. 6 is a cross-sectional view of the structure taken generally along line 6-6 in FIG. 5.

With reference to FIGS. 5, 6 in which like reference numerals refer to like features in FIGS. 3, 4 and at a subsequent fabrication stage of the processing method, one or more interlayer dielectric layers 28 and a passivation layer 30 are formed in a layer stack over the fins 12, the sacrificial gate structure 18, the source/drain regions 24, 26, and the surrounding open space over the dielectric layer 14. The one or more interlayer dielectric layers 28 may be composed of a dielectric material, such as carbon-doped silicon dioxide, and the passivation layer 30 may be composed of a dielectric material, such as silicon nitride. The one or more interlayer dielectric layers 28 and passivation layer 30 may be formed by middle-of-line (MOL) processing and back-end-of-line (BEOL) processing, which includes formation of contacts, vias, and wiring (not shown) as metallization for an interconnect structure 36. The metallization of the interconnect structure 36 may be connected with the source/drain region 24 and the source/drain region 26 of the structure 10 to provide paths for supplying an input current to the structure 10 and detecting the gated output current from the structure 10.

A cavity 32 is formed in the one or more interlayer dielectric layers 28 and the passivation layer 30. The cavity 32 extends to expose a portion of the sacrificial gate structure 18, which is in turn arranged over sections of the fins 12 arranged between the source/drain regions 24, 26. The cavity 32 may be patterned by lithography and etching processes that remove the one or more interlayer dielectric layers 28 and passivation layer 30 over the designated portion of the sacrificial gate structure 18. The cavity 32 penetrates through the passivation layer 30 to permit external access for providing an analyte solution in the cavity 32.

The dummy gate 22 of the exposed portion of the sacrificial gate structure 18 is removed from inside the cavity 32 with an etching process. The etching process may remove the material of the dummy gate 22 selective to the material of the dielectric layer 20. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. The removal of the dummy gate 22 exposes the dielectric layer 20 covering the surfaces 13, 15 (FIG. 1) of the sections of the fins 12 inside the boundary of the cavity 32 and also exposes the dielectric layer 20 on the dielectric layer 14 between the fins 12. In the representative embodiment, the sacrificial gate structure 18 is partially removed to form the cavity 32.

A sensing layer 34 is formed as a membrane on the dielectric layer 20 over the sections of the fins 12 exposed inside the cavity 32 and over the dielectric layer 14 in the spaces between the fins 12. The sensing layer 34 may be conformally applied over the exposed surfaces 13, 15 (FIG. 2) of the fins 12, and the dielectric layer 20 is arranged between the sensing layer 34 and the fins 12. The sensing layer 34 may be composed of a material that can form bonds with hydrogen ions in an analyte solution provided in the cavity 32. In an embodiment, the sensing layer 34 may be composed of a metal oxide. In an embodiment, the sensing layer 34 may be composed of silicon dioxide, silicon nitride, tantalum oxide, or aluminum oxide. In an embodiment, the sensing layer 34 may be conformally deposited by atomic layer deposition with a thickness that is substantially uniform over the uneven, nonplanar geometry of surfaces 13, 15 of the fins 12. The sensing layer 34 may be removed from bond pads, which are exposed at the surface of the passivation layer 30 and are connected with metallization of the interconnect structure 36.

The substrate 16 functions as a primary gate of the structure 10, and the solution in the cavity 32 functions as a front gate of the structure 10. As the pH of the solution varies, the threshold voltage of the front gate of the structure 10 will vary due to variations in the surface hydrolysis of hydroxyl groups with binding sites at the surface of the sensing layer 34. The variation in the threshold voltage results in a change in the current flowing through the fins 12 between the source/drain regions 24, 26. In an embodiment, the structure may be used as a biosensor.

The combination of the fins 12 and the sensing layer 34 provides a non-planar sensing structure. The sensitivity of the structure 10 is increased by increasing the capacitance of the front gate through an increase in the area of the sensing layer 34 available for sensing, as opposed to the available area of a planar layer, without increasing the device footprint. The effective area of the sensing layer 34 is increased due to the presence of the fins 12 acting as three-dimensional mandrel shapes coated by the sensing layer 34. The number of fins 12, as well as their height and/or cross-sectional area, may be selected to provide a desired improvement in sensor sensitivity within given design layout limitations.

Figure 7:
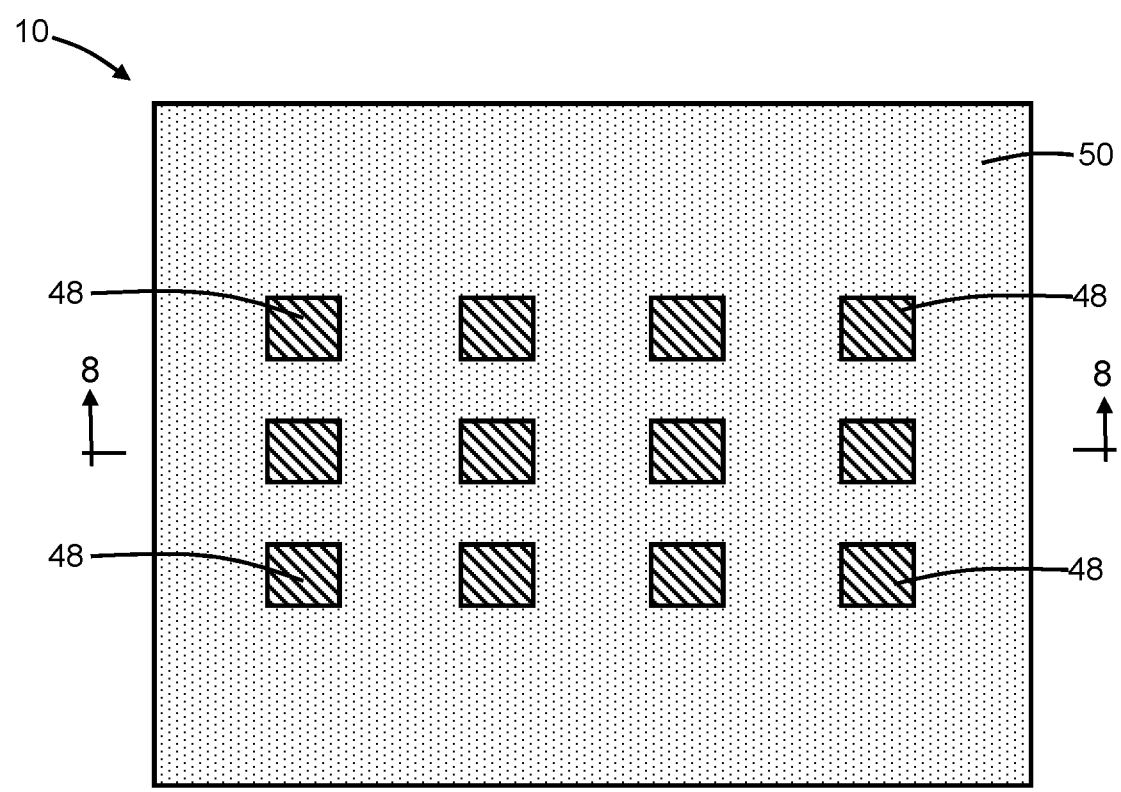
FIG. 7 is top view of a structure at a fabrication stage of a processing method in accordance with alternative embodiments of the invention.
Figure 8:
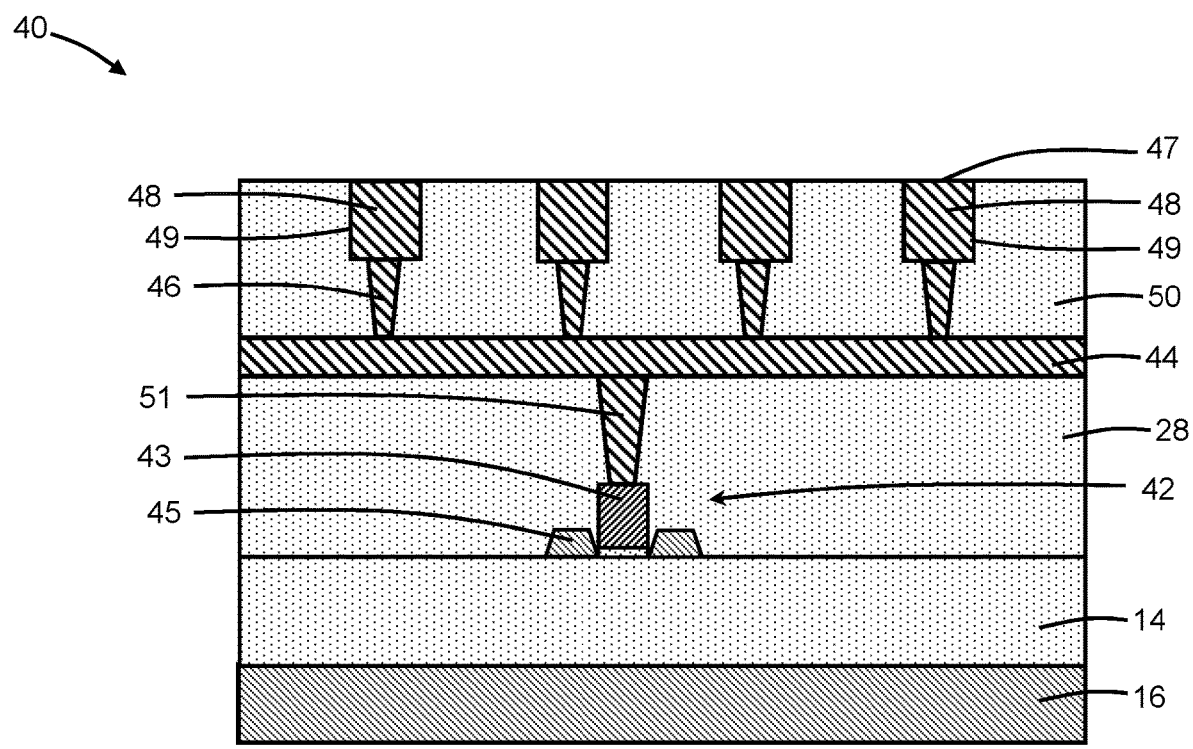
FIG. 8 is a cross-sectional view of the structure taken generally along line 8-8 in FIG. 7.

With reference to FIGS. 7, 8 and in accordance with alternative embodiments, a structure 40 may include a field-effect transistor 42 that is fabricated by front-end-of-line (FEOL) processing using the device layer of the SOI wafer. The field-effect transistor 42 may include a gate electrode 43 and a gate dielectric formed by depositing a layer stack and patterning the layer stack with photolithography and etching. The gate electrode 43 may be composed of a conductor, such as doped polycrystalline silicon (i.e., polysilicon) or a work function metal, and the gate dielectric may be composed of an electrical insulator, such as silicon dioxide or hafnium oxide. The field-effect transistor 42 may include other elements such as source/drain regions 45, silicide on the source/drain regions 45, halo regions, lightly doped drain extensions, and non-conductive sidewall spacers on the gate electrode 43.

The interconnect structure 36 is formed over the field-effect transistor 42. The interconnect structure 36 includes metallization 44 in the one or more interlayer dielectric layers 28 that is directly coupled by a contact and/or via 51 with the gate electrode 43 of the field-effect transistor 42.

Additional metallization (not shown) of the interconnect structure 36 may be coupled with the source/drain regions 45 of the field-effect transistor 42.

Multiple features 48 may be formed in an interlayer dielectric layer 50 of a single metallization level of the interconnect structure 36 overlying the metallization 44. The features 48 may be metal pillars arranged in trenches formed by a dual-damascene process, which also forms via openings including vias 46 coupling the metal pillars with the metallization 44. The vias 46 and features 48 may be composed of a metal, such as copper, tungsten, or cobalt.

The features 48 may be arranged in an array and, in an embodiment, the features 48 may be arranged in the rows and columns of a two-dimensional array. In an alternative embodiment, the features 48 may be arranged differently with linear placement in a one-dimensional array. The features 48 provide three-dimensional mandrel shapes with a top surface 47 and side surfaces 49 in the form of sidewalls extending from the top surface 13 to the interlayer dielectric layer 50.

Figure 9:
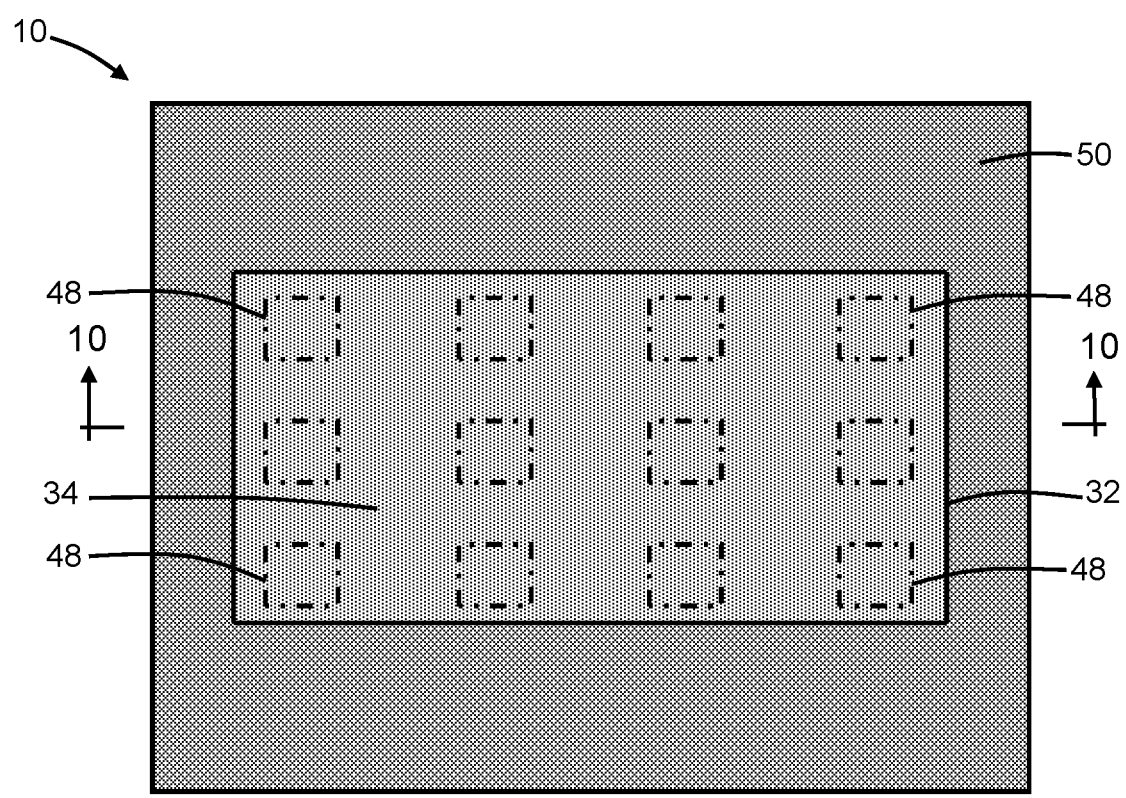
FIG. 9 is top view of the structure at a fabrication stage subsequent to FIG. 7.
Figure 10:
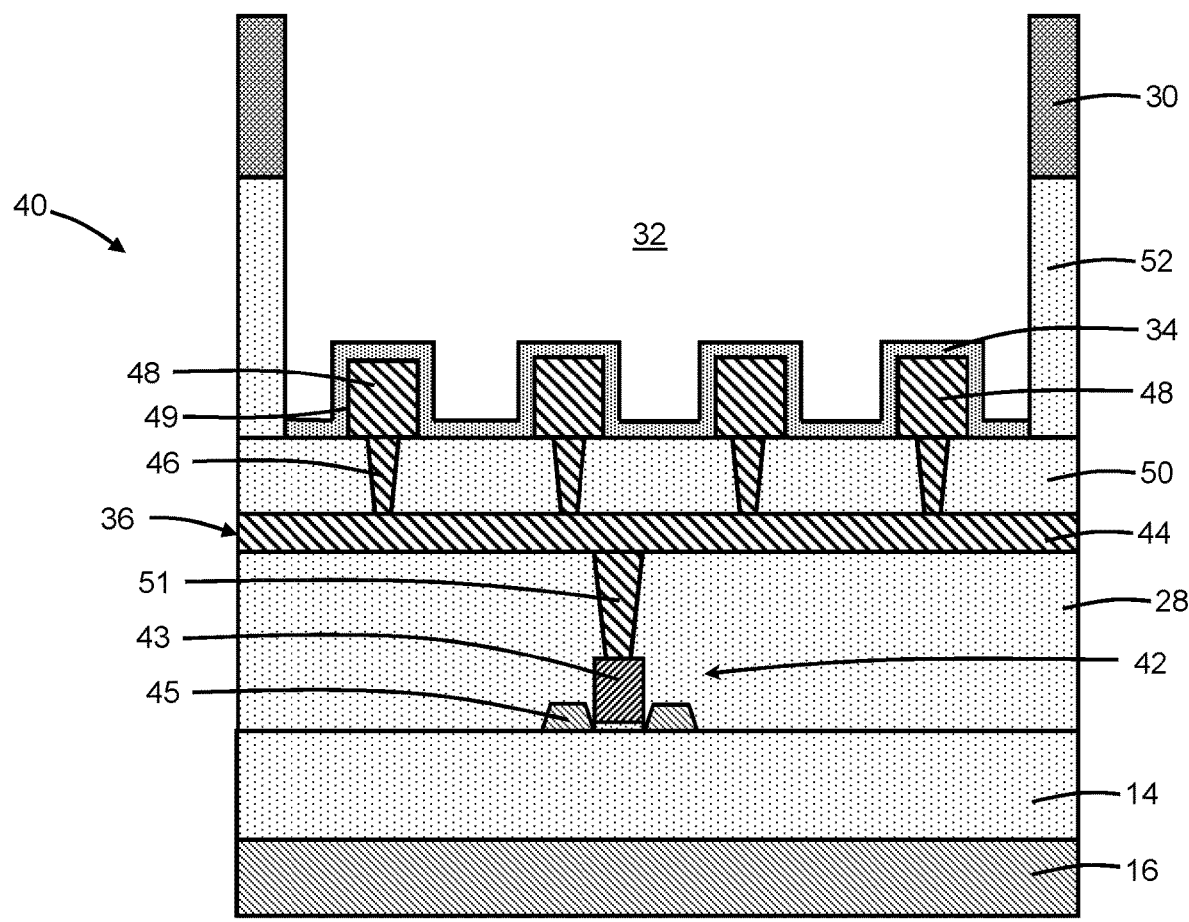
FIG. 10 is a cross-sectional view of the structure taken generally along line 10-10 in FIG. 9.

With reference to FIGS. 9, 10 in which like reference numerals refer to like features in FIGS. 7, 8 and at a subsequent fabrication stage of the processing method, an interlayer dielectric layer 52 is formed over the interlayer dielectric layer 50. The cavity 32 is formed, as previously described, in the passivation layer 30 and the interlayer dielectric layer 50, and the interlayer dielectric layer 50 is subsequently recessed with an etching process relative to the features 48 in order to expose the side surfaces 49 of the features 48. In an embodiment, the interlayer dielectric layer 50 is fully recessed relative to the features 48 such that the side surfaces 49 are fully exposed. In an alternative embodiment, the interlayer dielectric layer 50 may be partially recessed relative to the features 48 such that upper portions of the side surfaces 49 are revealed and lower portions of the side surfaces 49 remain embedded in the interlayer dielectric layer 50.

The sensing layer 34 is subsequently formed, as previously described, by a conformal deposition technique over the features 48. The combination of the features 48 and the sensing layer 34 provides a non-planar sensing structure. The number of features 48, as well as their height above the interlayer dielectric layer 50 and/or cross-sectional area, may be selected to provide a desired improvement in sensor sensitivity within given design layout limitations.

Figure 11:
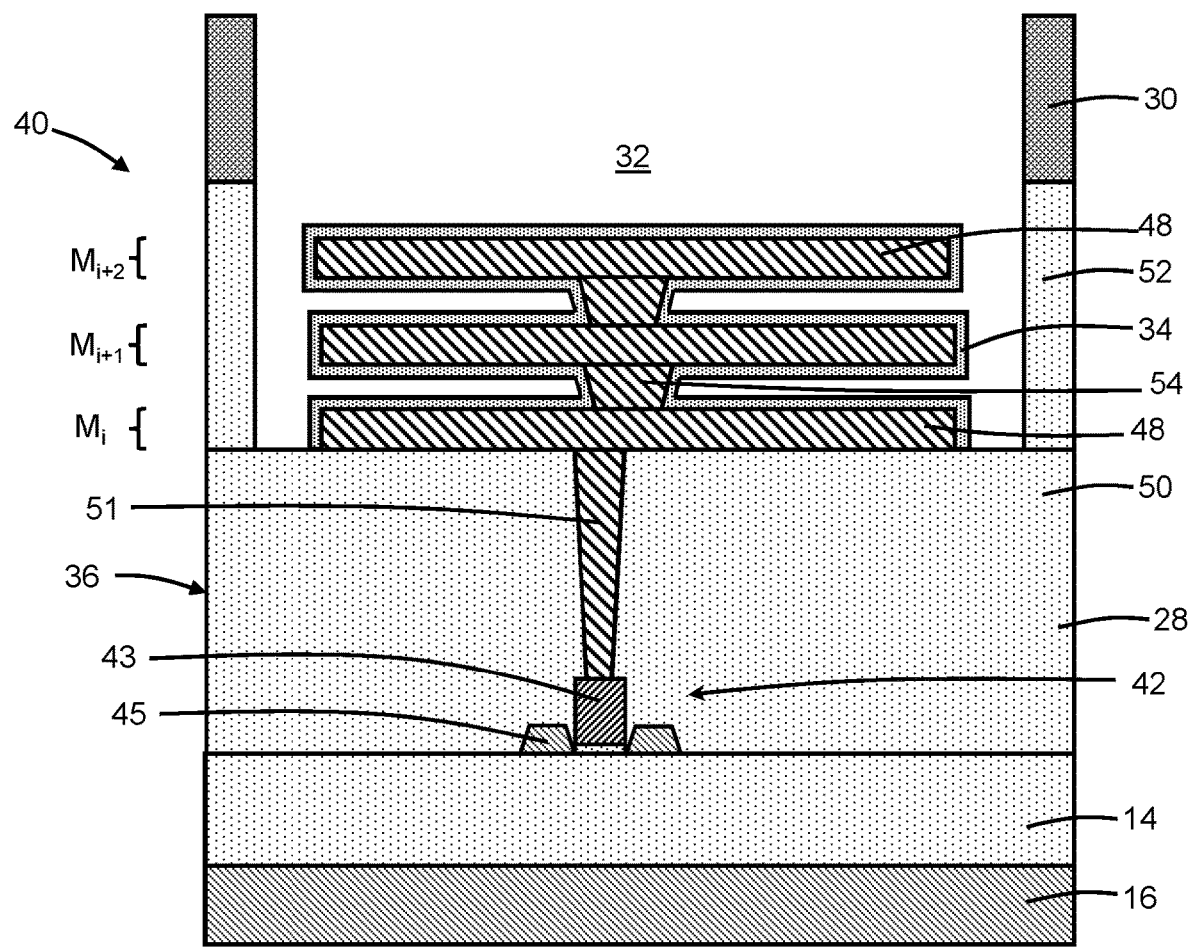
FIGS. 11 and 12 are cross-sectional views of structures in accordance with alternative embodiments of the invention.

With reference to FIG. 11 in which like reference numerals refer to like features in FIG. 10 and in accordance with alternative embodiments, the features 48 may be arranged as metal pillars in a vertical one-dimensional array, instead of being arranged in a lateral two-dimensional array as in FIG. 10. To that end, the features 48 may be formed in different interlayer dielectric layers 28 associated with multiple metallization levels (e.g., Mi, Mi+1, Mi+2) of the interconnect structure 36. In an embodiment, the features 48 are formed only in the one or more interlayer dielectric layers 28 associated with multiple metallization levels of the interconnect structure 36 and are not formed in the passivation layer 30 of the interconnect structure 36.

Adjacent pairs of the features 48 are coupled together by vias 56, which provide vertical interconnections. The lowest feature 48 in the stack is coupled by the contact and/or via 51 with the gate electrode 43 of the field-effect transistor 42. The features 48 and vias 56 may be formed by a damascene process. As previously described, the cavity 32 is formed after forming the features 48, and the sensing layer 34 is applied as a conformal coating to the features 48, which are exposed after forming the cavity 32.

Figure 12:
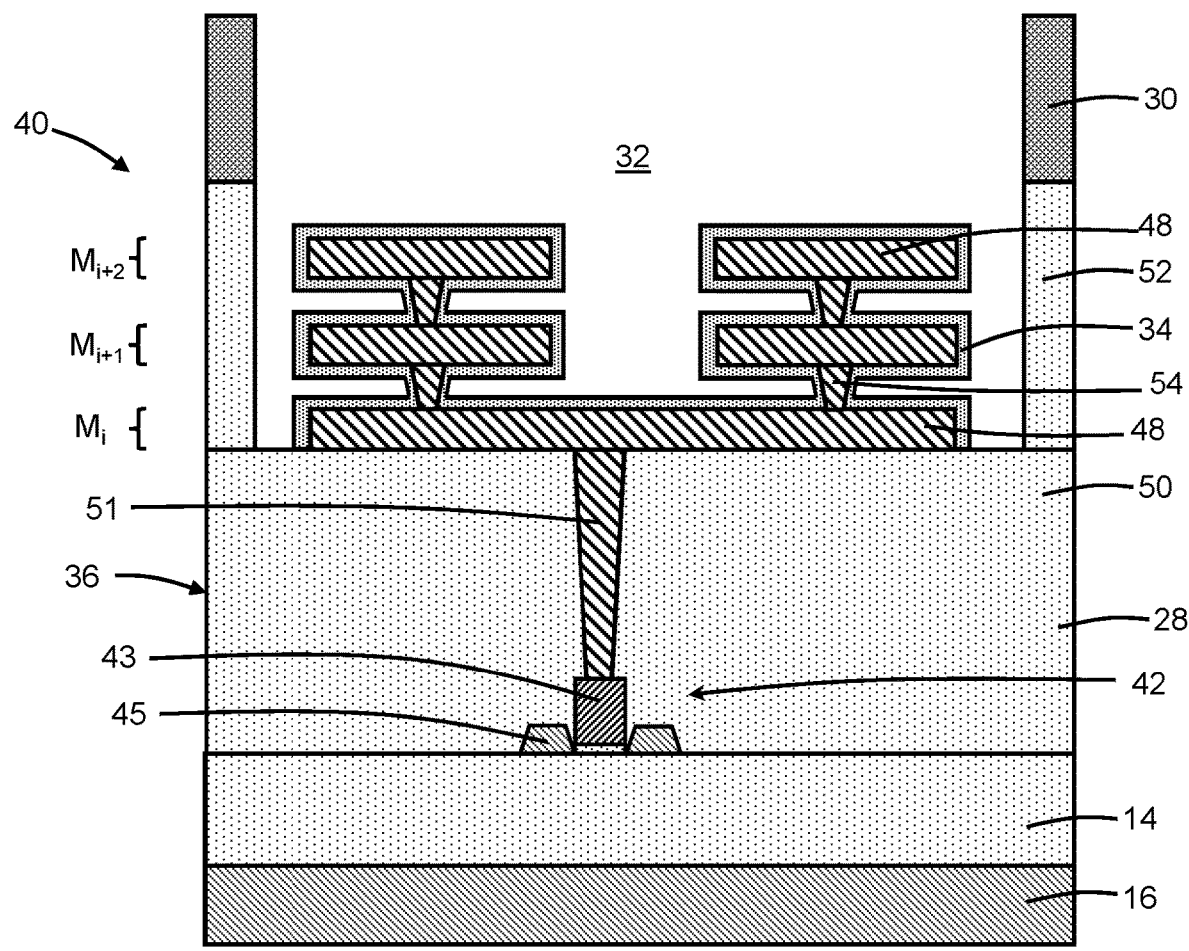

With reference to FIG. 12 in which like reference numerals refer to like features in FIG. 10 and in accordance with alternative embodiments, multiple features 48 may be arranged as metal pillars in each of one or more of the individual metallization levels of the interconnect structure 36 and then exposed within the cavity 32. Vertical interconnections between the features 48 are provided by the vias 56. The features 48 and vias 56 may be formed by a damascene process. The feature 48 in the lowest metallization level may be unbroken, and may be coupled by the contact and/or via 51 with the gate electrode 43 of the field-effect transistor 42. As previously described, the cavity 32 is formed after forming the features 48, and the sensing layer 34 is applied as a conformal coating to the features 48 that are exposed after forming the cavity 32. The combination of the features 48 and the sensing layer 34 provides a non-planar sensing structure.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or "in direct contact with" another feature if intervening features are absent. A feature may be "indirectly on" or "in indirect contact with" another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a sensor, the structure comprising:
a plurality of semiconductor fins each having a top surface and a plurality of side surfaces;
a sensing layer on the top surface and the side surfaces of each semiconductor fin; and
an interconnect structure including one or more first interlayer dielectric layers over the semiconductor fins, the one or more first interlayer dielectric layers including a cavity arranged to expose the sensing layer,
wherein the sensing layer is comprised of a material that is sensitive to a property of an analyte solution provided in the cavity.

2. The structure of claim 1 wherein the material is configured to form bonds with hydrogen ions in the analyte solution provided in the cavity.

3. The structure of claim 1 wherein the material is comprised of silicon dioxide, silicon nitride, tantalum oxide, or aluminum oxide.

4. The structure of claim 1 wherein the sensing layer is conformally arranged on the top surface and the side surfaces of each semiconductor fin.

5. The structure of claim 1 wherein the sensing layer is conformally arranged on the top surface and the side surfaces of each feature.

6. The structure of claim 1 wherein the semiconductor fins are arranged in rows of a one-dimensional array.

7. The structure of claim 1 further comprising:
a substrate including a primary gate; and
a dielectric layer between the semiconductor fins and the substrate.

8. The structure of claim 1 further comprising:
a source region arranged at a first end region of the semiconductor fins; and a drain region arranged at a second end region of the semiconductor fins,
wherein the cavity is laterally arranged over a section of each semiconductor fin between the source region and the drain region.

9. The structure of claim 1 further comprising:
a conformal dielectric layer arranged on the top surface and the side surfaces of each semiconductor fin,
wherein the sensing layer is separated from the semiconductor fins by the conformal dielectric layer.

10. A structure for a sensor, the structure comprising:
a plurality of features each having a top surface and a plurality of side surfaces;
a sensing layer on the top surface and the side surfaces of each feature; and
an interconnect structure including one or more first interlayer dielectric layers over the features and a second interlayer dielectric layer, the one or more first interlayer dielectric layers including a cavity arranged to expose the sensing layer, and the top surface and the side surfaces of the features arranged inside the cavity over the second interlayer dielectric layer,
wherein the sensing layer is comprised of a material that is sensitive to a property of an analyte solution provided in the cavity.

11. The structure of claim 10 further comprising:
a field-effect transistor having a gate electrode,
wherein the interconnect structure includes metallization coupling the gate electrode with the features.

12. The structure of claim 10 wherein the features are a plurality of metal pillars that are arranged in rows and columns of a two-dimensional array.

13. The structure of claim 10 wherein the features are comprised of a metal, and the features are arranged in multiple metallization levels of the interconnect structure.

14. The structure of claim 10 wherein the material is comprised of silicon dioxide, silicon nitride, tantalum oxide, or aluminum oxide.

15. A method of forming a sensor, the method comprising:
forming a plurality of semiconductor fins each having a top surface and a plurality of side surfaces;
forming a sensing layer on the top surface and the side surfaces of each semiconductor fin;
forming an interconnect structure including one or more first interlayer dielectric layers over the semiconductor fins; and
forming a cavity in the one or more first interlayer dielectric layers that is arranged to expose the sensing layer,
wherein the sensing layer is comprised of a material that is sensitive to a property of an analyte solution provided in the cavity.

16. The method of claim 15 wherein forming the sensing layer on the top surface and the side surfaces of each semiconductor fin comprises:
conformally depositing the sensing layer over the top surface and the side surfaces of each semiconductor fin.

17. The method of claim 15 wherein the semiconductor fins are formed by patterning a device layer of a semiconductor-on-insulator wafer.

18. The method of claim 17 further comprising:
forming a sacrificial gate structure over the semiconductor fins; and
after forming the cavity, removing a portion of the sacrificial gate structure exposed by the cavity.

19. The method of claim 17 further comprising:
forming a source region arranged at a first end region of the semiconductor fins; and forming a drain region arranged at a second end region of the semiconductor fins,
wherein the cavity is laterally arranged over a section of each semiconductor fin between the source region and the drain region.

20. The method of claim 15 wherein the material is comprised of silicon dioxide, silicon nitride, tantalum oxide, or aluminum oxide, and the sensing layer is conformally arranged on the top surface and the side surfaces of each semiconductor fin.

* * * * *